US010078113B1

United States Patent
Usgaonkar et al.

(10) Patent No.: US 10,078,113 B1
(45) Date of Patent: Sep. 18, 2018

(54) METHODS AND CIRCUITS FOR DEBUGGING DATA BUS COMMUNICATIONS

(71) Applicant: Xilinx, Inc., San Jose, CA (US)

(72) Inventors: Kapil Usgaonkar, Hyderabad (IN); Niloy Roy, Hyderabad (IN)

(73) Assignee: XILINX, INC., San Jose, CA (US)

(*) Notice: Subject to any disclaimer, the term of this patent is extended or adjusted under 35 U.S.C. 154(b) by 90 days.

(21) Appl. No.: 14/736,790

(22) Filed: Jun. 11, 2015

(51) Int. Cl.
*G01R 31/28* (2006.01)
*G06F 11/00* (2006.01)
*G01R 31/3177* (2006.01)

(52) U.S. Cl.
CPC ................. *G01R 31/3177* (2013.01)

(58) Field of Classification Search
CPC .. G01R 13/02; G01R 31/317; G01R 31/3177; G01R 31/318519; G01R 31/3191; G06F 11/348; G06F 11/3636; G06F 11/364; G06F 11/3648; G06F 13/385; G06F 13/20; G06F 9/3005; G06F 9/3861; G06F 11/24; H04L 27/368; H03K 19/17764; H03K 19/17732
See application file for complete search history.

(56) References Cited

U.S. PATENT DOCUMENTS

| | | | | |
|---|---|---|---|---|
| 6,615,368 B1* | 9/2003 | Dunlap | ................. | G06F 9/3005 712/E9.032 |
| 6,751,751 B1* | 6/2004 | Murray | ................. | G06F 11/364 710/15 |
| 6,792,563 B1* | 9/2004 | DesRosier | ............ | G06F 11/364 714/43 |
| 7,576,558 B1* | 8/2009 | Lysaght | ........... | H03K 19/17764 326/16 |
| 7,840,781 B1* | 11/2010 | Velusamy | ............. | G06F 11/348 712/32 |
| 8,229,025 B1* | 7/2012 | Summerfield | ........ | H04L 27/368 375/285 |
| 8,874,801 B1* | 10/2014 | Ramineni | ............. | G06F 13/385 710/15 |
| 2006/0036919 A1* | 2/2006 | Creigh | ............... | G01R 31/3177 714/724 |

(Continued)

OTHER PUBLICATIONS

LogiCORE IP AXI Master Burst v2.0 Product Guide for Vivado Design Suite PG162 Dec. 18, 2013 pp. 1-43.*

(Continued)

*Primary Examiner* — Guerrier Merant
(74) *Attorney, Agent, or Firm* — LeRoy D. Maunu

(57) ABSTRACT

Various example implementations are directed to circuits and methods for debugging logic circuits utilizing a data bus for communication. According to an example implementation, an apparatus includes a logic circuit configured to communicate data over a data bus according to a communication protocol. The apparatus also includes a logic analyzer circuit coupled to the data bus. The logic analyzer circuit is configured to capture, in response to a control signal, samples of data signals communicated on the data bus. The logic analyzer circuit determines respective pairs of start and end positions of the data transactions in the captured samples. The logic analyzer circuit outputs the samples of the data signals and a set of metadata including the determined pairs of start and end positions of data transactions in the samples.

20 Claims, 6 Drawing Sheets

(56) References Cited

U.S. PATENT DOCUMENTS

| | | | | |
|---|---|---|---|---|
| 2006/0041803 | A1* | 2/2006 | Woodward | G01R 31/3177 714/724 |
| 2010/0042975 | A1* | 2/2010 | Schneider | G06F 11/3648 717/125 |
| 2011/0057643 | A1* | 3/2011 | Su | G01R 13/02 324/76.39 |
| 2011/0321015 | A1* | 12/2011 | Chew | G06F 11/364 717/127 |

OTHER PUBLICATIONS

Virtex-6 FPGA Memory Interface Solutions User Guide UG406 Mar. 20, 2013 pp. 1-334.*
Functional Testing and Validation for DDR4 and LPDDR4 Jennie Grosslight, Keysight Technologies Inc May 22, 2015 pp. 1-8.*
U4301A PCIe Gen3 Analyzer Jul. 2013, pp. 1-134.*
Get the Most Out of Your Logic Analyzer Chris Loberg Mar. 7, 2013; pp. 1-11.*
Agilent Technologies 16717A Logic Analyzer; 1992-2002; pp. 1-231.*
Logic Analyzer Software Setup 2000-2016; pp. 1-4.*

* cited by examiner

METHODS AND CIRCUITS FOR DEBUGGING DATA BUS COMMUNICATIONS

TECHNICAL FIELD

The disclosure generally relates to testing and debugging logic circuits, and more particularly to testing and debugging integrated circuits that communicate data via a data bus.

BACKGROUND

Programmable logic devices (PLDs) are a well-known type of programmable integrated circuit (IC) that can be programmed to perform specified logic functions. One type of PLD, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

SUMMARY

Various example implementations are directed to circuits and methods for debugging logic circuits utilizing a data bus for communication. According to an example implementation, an apparatus includes logic circuit configured to communicate data over a data bus according to a communication protocol. The apparatus also includes a logic analyzer circuit (e.g., an integrated logic analyzer circuit) coupled to the data bus. The logic analyzer circuit is configured to capture, in response to a debug control signal, samples of data signals communicated on the data bus. The logic analyzer circuit determines respective pairs of start and end positions of the data transactions in the captured samples. The logic analyzer circuit outputs the samples of the data signals and a set of metadata including the determined pairs of start and end positions of the data transactions in the samples.

A method is also disclosed for debugging a logic circuit that utilizes a data bus for communication. Using a logic analyzer circuit coupled to the data bus, samples of data signals on the data bus are captured in response to a debug control signal. A respective start position and a respective end position of each data transaction in the captured samples are determined using the logic analyzer circuit. The samples of the data signals and a set of metadata, including the determined pairs of start and end positions of the data transactions in the samples, are output by the logic analyzer circuit.

Other features will be recognized from consideration of the Detailed Description and Claims, which follow.

BRIEF DESCRIPTION OF THE DRAWINGS

Various aspects and features of the disclosed methods and circuit will become apparent upon review of the following detailed description and upon reference to the drawings in which.

DETAILED DESCRIPTION

Figure 1:
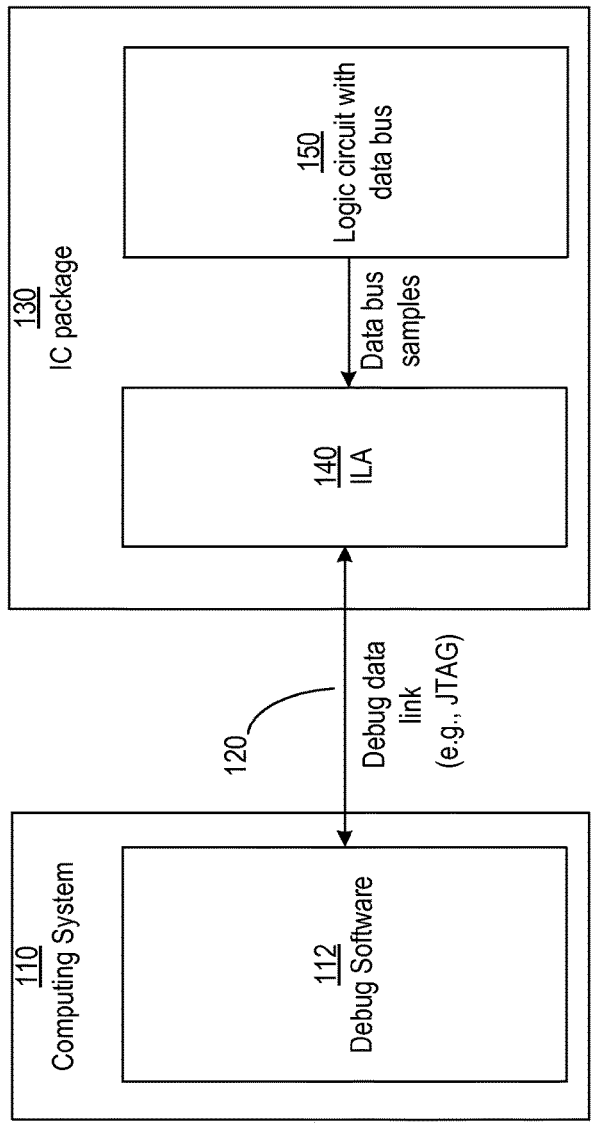
FIG. 1 shows an example system for debugging a logic circuit having a data bus.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein.

Debugging is an integral part of developing circuit designs. Debugging a circuit design to be implemented on a programmable IC typically involves testing operation of the programmable IC after it has been programmed to implement the circuit design. The testing may include, for example, providing test data to the programmable IC and capturing data signals from various nodes within the programmable IC. Commonly, the inputting of test data and capturing of data signals are performed by an integrated logic analyzer circuit connected to the programmable IC in an IC package. An IC package provides a protective covering for one or more IC dies, external data terminals for communicating data to or from the IC dies, and signal lines connecting the data terminals to the IC dies and/or interconnecting the IC dies.

One difficulty in debugging ICs involves debugging data bus interfaces to ensure that data transactions comply with all requirements of a communication protocol used by the data bus. Currently, developers must visually inspect a waveforms of sampled data signals communicated on a data bus to manually identify individual data transactions and/or determine if a violation of the communication protocol has occurred. Similarly, developers must visually inspect a waveform to determine transaction-level performance metrics such as throughput, latency, byte count, beat count, etc. Visual inspection of waveforms becomes increasingly difficult as the number of transactions increases.

Methods and circuits are disclosed for debugging logic circuits utilizing a data bus for communication. According to an example implementation, an apparatus includes a logic circuit configured to communicate data over a data bus according to a communication protocol. The apparatus also includes an integrated logic analyzer circuit coupled to the data bus. The integrated logic analyzer circuit is configured to capture, in response to a debug control signal, samples of data signals on the data bus. Capturing a sample of a data signal quantizes analog characteristics (e.g., voltage, phase, or amplitude) of the data signal at a moment in time. Captured samples may be used to create a graphical waveform representation of the data signals for visual inspection. The integrated logic analyzer circuit determines start and end positions of data transactions in the captured samples. The start position corresponds to a sample captured at the time the transaction was initiated and the end position corresponds to a sample captured at the time the transaction completed. The integrated logic analyzer circuit outputs the captured samples along with a set of metadata that includes the determined start and end positions.

In some implementations, the integrated logic analyzer circuit is also configured to evaluate the captured samples for various performance metrics. The performance metrics may include, for example, latency, throughput, cumulative byte count, cumulative beat count, number of idle cycles on the data bus, or combinations thereof. A beat refers to a single transmission cycle for communication on the data bus. A burst-mode transaction may transmit a number of data transactions over a number of sequential data beats. The integrated logic analyzer circuit may output the performance metrics in the set of metadata, which is output along with the captured samples of the data signals.

In some implementations, the integrated logic analyzer circuit is also configured to detect violations of a communication protocol used by the data bus. In different implementations, the integrated logic analyzer circuit may be configured to detect violations of various communication protocols including, but not limited to, those of the Advanced Microcontroller Bus Architecture (AMBA) Advanced Extensible Interface (AXI), Peripheral Component Interconnect Express (PCIe), Universal Serial Bus (USB), IEEE1394, and/or Serial Attached SCSI. The integrated logic analyzer circuit may output violation status data characterizing detected violations. The violation status data may include, for example, a signal indicating whether or not a violation has been detected, the position of the detected protocol violations in the samples of the data signals, and/or types of detected protocol violations.

In some implementations, the integrated logic analyzer circuit is configured to initiate capture of samples of data signals in response to one or more trigger events. As one example, the integrated logic analyzer circuit may be configured to begin capturing samples of data signals in response to receiving a debug control signal (e.g., from a debugging system coupled to the integrated logic analyzer circuit via a debug data link). As another example, the integrated logic analyzer circuit may be configured to begin capturing samples in response to detecting a protocol violation.

The integrated logic analyzer circuit outputs the samples of the data signals and a set of metadata including the determined performance metrics and the determined pairs of start and end positions of the data transactions in the samples. In some implementations, the samples and metadata are communicated to a debugging tool that is connected to the integrated logic analyzer circuit via a debugging data link. The debugging data link may utilize various communication protocols to communicate data between the debugging tool and the integrated logic analyzer circuit including, for example, JTAG, PCIe, gigabit Ethernet, and/or serial ATA.

The debugging tool includes a graphical user interface (GUI) configured to display the samples as a waveform with graphical markers for events specified by the debug metadata. Events may include, for example, start and end positions of data transactions in the waveform or positions of detected protocol violations. The debugging tool may also display performance metrics included in the debug metadata.

The debugging tool may communicate debug control signals to the integrated logic analyzer circuit in response to user input. For example, the debugging tool may transmit debug control signals to prompt the integrated logic analyzer circuit to begin capture of the samples or transmit control signals to configure metadata to be generated by the integrated logic analyzer circuit. In some implementations, the debugging tool may also provide a test data sequence for input to one or more logic circuits via the debugging data link.

Turning now to the figures, FIG. 1 shows an example system for debugging a logic circuit having a data bus. The system includes an IC package 130 having an integrated logic analyzer circuit 140 connected to a logic circuit 150 having a data bus. The integrated logic analyzer circuit 140 is configured to capture, in response to a trigger event, samples of data signals communicated on the data bus included in the logic circuit 150. As previously described, the trigger event may be, for example, the receipt of a debug control signal from a software-based debugging tool 112 running on a computing system 110 coupled to the integrated logic analyzer circuit 140 via a debug data link 120. As another example, the trigger event may be detection of a protocol violation by the integrated logic analyzer circuit 140.

The integrated logic analyzer circuit determines various characteristics of data signals communicated on the data bus including, for example, start and end positions of data transactions in the samples, performance metrics, and/or protocol violation data. The integrated logic analyzer circuit 140 communicates the samples of the data signals and a set of metadata including the determined characteristics of the data signals to the debugging tool 112 via the debug data link 120. As previously described, the debugging tool 112 includes a GUI configured to display the received samples as a waveform with graphical markers for events specified by the debug metadata such as start and end positions of data transactions in the waveform or positions of detected protocol violations.

Figure 2:
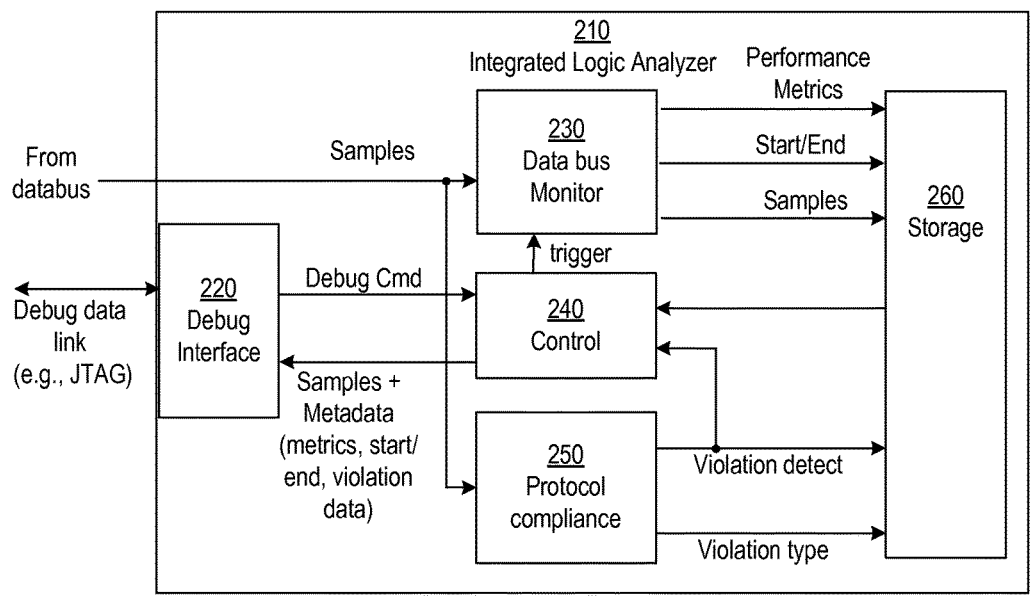
FIG. 2 shows an example integrated logic analyzer circuit.

FIG. 2 shows an example integrated logic analyzer circuit. In this example, the integrated logic analyzer circuit 210 includes a data bus monitor circuit 230 configured to capture samples of data signals on a data bus in response to a debug control signal. The data bus monitor circuit 230 determines start and end positions of data transactions in the samples. The detection of start and end positions of data transactions may be performed by monitoring samples of various ones of the data signals communicated over the data bus for values indicative of the start or end of a transaction. The data signals to be monitored and the values indicative of the start or end of a transaction depends on the communication protocol used by the data bus. As one example, the start position of an AXI data transaction can be identified by the assertion of a VALID or READY signal. The end position of an AXI read transaction can be identified by an RLAST signal being asserted and cleared. The end position of an AXI write transaction can be identified by a WLAST signal being asserted followed by a BRESP being asserted.

In some implementations, the data bus monitor circuit 230 may also determine various performance metrics such as throughput, latency, beat count, byte count, idle cycle count, etc. In this example, the data bus monitor circuit 230 stores the samples, start and end positions, and the performance metrics in a storage circuit 260.

In this example, the integrated logic analyzer circuit 210 includes a protocol compliance circuit 250 configured to monitor the sampled data bus signals for violations of the communication protocol used by the data bus. In this example, the protocol compliance circuit 250 generates violation status data characterizing the detected violations. In this example, the violation status data includes a violation detect signal indicating whether or not a protocol violation has been detected. The generated status data also includes a violation-type signal indicating type(s) of violations that are detected. The violation-type signal may include a respective bit for each possible type of violation that may occur. The bit may be set to logic level 1 if the violation is detected and otherwise set to logic level 0. The possible types of violations that may be detected depends on requirements/limitations of data transactions specified by the communication protocol used by the data bus. As one example, the AXI protocol requires the length of a fixed burst mode transaction to be no more than 16 beats. As another example of an AXI violation, ARADDR, ARBURST, ARCACHE, ARID, ARLEN, ARLOCK, ARPROT, ARSIZE, ARQOS, and ARREGION signals must remain stable when a ARVALID signal is asserted and a ARREADY signal is low.

The violation detect signal and the violation-type signal are stored in the storage circuit 260 along with the samples, transaction start and end positions, and performance metrics. For ease of reference, the transaction start/end positions, performance metrics, and/or violation status data may be jointly or individually referred to as debug metadata.

The integrated logic analyzer circuit 210 includes a debug interface 220, configured to communicate with a hardware or software debugging tool via a debug data link (e.g., JTAG). The control circuit 240 is coupled to the debug interface and data bus monitor circuit 230. The control circuit 240 is configured to provide a trigger signal to the data bus monitor circuit 230 to initiate capturing of samples of the data signals. The control circuit may provide the trigger signal in response to a trigger event, such as the receipt of a debug control signal via the debug interface 220 or detection of a protocol violation by the protocol compliance circuit 250 (e.g., as indicated by the violation detect signal). The control circuit 240 is configured to retrieve the samples of the data signals and debug metadata from the storage circuit 260 and output the retrieved samples and debug metadata via the debug interface 220. In some implementations, the retrieved samples of the data signals and debug metadata are temporally aligned, such that aligned portions of samples and metadata correspond to the same time period. Temporal alignment of the samples and debug metadata may be performed by the control circuit 240 or may be performed by the data bus monitor circuit 230 or the protocol compliance circuit 250 when storing the samples and/or debug metadata in the storage circuit 260.

Figure 3:
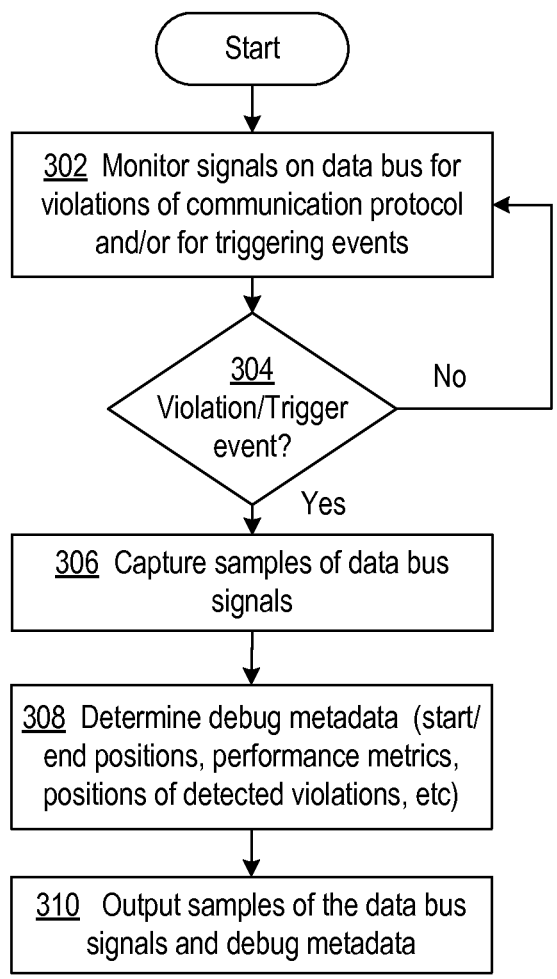
FIG. 3 shows an example process for debugging a data bus, consistent with one or more implementations.

FIG. 3 shows an example process for debugging a data bus, consistent with one or more implementations. At block 302, signals on the data bus are monitored for violations of a communication protocol. If a trigger event is detected, decision block 304 directs the process to block 306. As previously described, trigger events may include, for example, receipt of a debug control signal or detection of a protocol violation.

At block 306, samples of data signals are captured. At block 308, samples are analyzed to generate debug metadata. As previously discussed, the debug metadata may include start and end positions of data transactions, various performance metrics (e.g., latency, throughput, cumulative byte count, and/or cumulative beat count), and/or protocol violation data (e.g., presence of detected violations, location of a detected violation in captured samples, and/or type of each detected violation). At block 310, the samples of the data signals are output along with the debug metadata.

Figure 4:
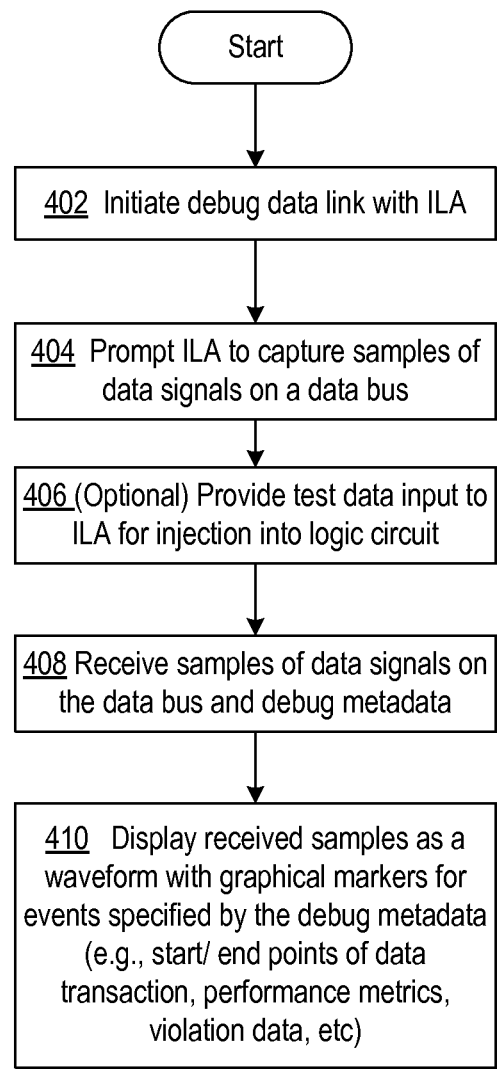
FIG. 4 shows an example debugging process performed by a debugging tool, consistent with one or more implementations.

FIG. 4 shows an example debugging process performed by a software-based debugging tool, consistent with one or more implementations. At block 402, a debugging data link (e.g. JTAG) to an integrated logic analyzer circuit is initiated. At block 404, the integrated logic analyzer circuit is prompted, via the debugging data link, to capture samples of data signals. Optionally at block 406, a test data sequence is provided to the integrated logic analyzer circuit, via the debugging data link, for input to a logic circuit. At block 408, the captured samples of the data signals and a set of debug metadata are received via the debug data link. At block 410, the received samples are displayed as a waveform with graphical markers for events specified by the debug metadata. Events may include, for example, start and end positions of data transactions in the waveform or positions of detected protocol violations. In some implementations, various performance metrics included in the debug metadata may also be displayed at block 410. The performance metrics may include, for example, cumulative beat count, cumulative byte count, throughput, latency, or combinations thereof.

Figure 5:
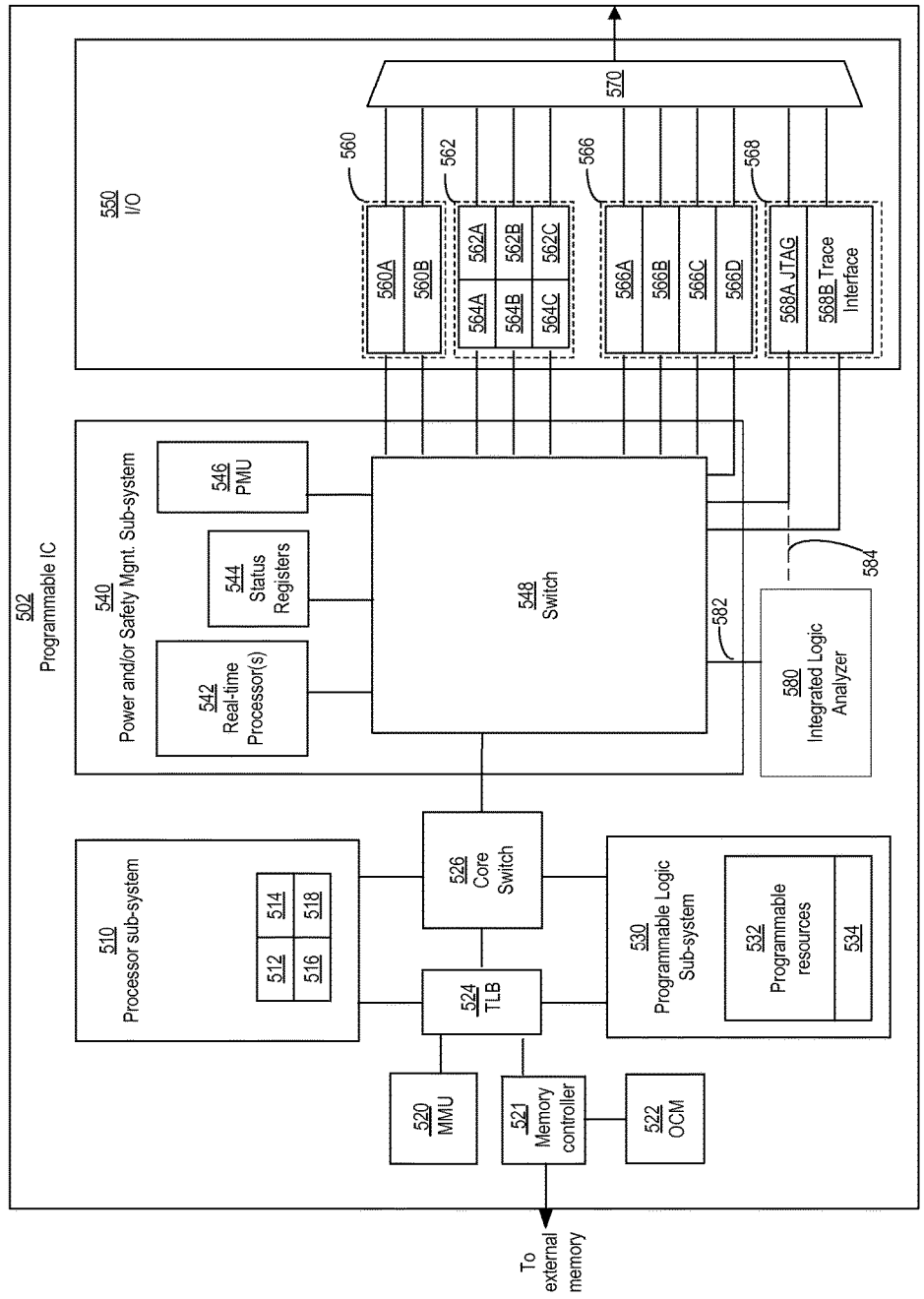
FIG. 5 shows an example programmable IC having an integrated logic analyzer circuit, in accordance with one or more implementations.

FIG. 5 shows a programmable IC 502 having an integrated logic analyzer circuit 580 consistent with one or more implementations. The programmable IC may also be referred to as a System On Chip (SOC), which includes a processor sub-system 510 and a programmable logic sub-system 530. In this example, the programmable IC also includes a sub-system 540 having various circuits for power and/or safety management and an input/output (I/O) sub-system 550 for communication of data with external circuits. The subsystems 510, 530, 540, and 550 may be formed using a plurality of semiconductor dies, and interconnected in an IC package as described in the above examples.

The processing sub-system 510 may be programmed to implement a software portion of the user design, via execution of a user program. The program may be specified as part of a configuration data stream or may be retrieved from an on-chip or off-chip data storage device. The processing sub-system 510 may include various circuits 512, 514, 516, and 518 for executing one or more software programs. The circuits 512, 514, 516, and 518 may include, for example, one or more processor cores, floating point units (FPUs), an interrupt processing unit, on chip-memory, memory caches, and/or cache coherent interconnect.

The programmable logic sub-system 530 of the programmable IC 502 may be programmed to implement a hardware portion of a user design. For instance, the programmable logic sub-system may include a number of programmable resources 532, which may be programmed to implement a set of circuits specified in a configuration data stream. The programmable resources 532 include programmable interconnect circuits, programmable logic circuits, and configuration memory cells. The programmable logic implements the logic of a user design using programmable elements that can include, for example, function generators, registers, arithmetic logic, and so forth. Programmable interconnect circuits may include a large number of interconnect lines of varying lengths interconnected by programmable interconnect points (PIPs).

The programmable resources 532 may be programmed by loading a configuration data stream into the configuration memory cells, which define how the programmable interconnect circuits and programmable logic circuits are configured. The collective states of the individual memory cells then determine the function of the programmable resources 532. The configuration data can be read from memory (e.g., from an external PROM) or written into the programmable IC 502 by an external device. In some implementations, configuration data may be loaded into configuration memory cells by a configuration controller 534 included in the programmable logic sub-system 530. In some other implementations, the configuration data may be loaded into the configuration memory cells by a start-up process executed by the processor sub-system 510.

The programmable IC 502 may include various circuits to interconnect the processing sub-system 510 with circuitry implemented within the programmable logic sub-system 530. In this example, the programmable IC 502 includes a core switch 526 that can route data signals between various data ports of the processing sub-system 510 and the programmable logic sub-system 530. The core switch 526 may also route data signals between either of the programmable logic or processing sub-systems 510 and 530 and various other circuits of the programmable IC, such as an internal data bus. Alternatively or additionally, the processing sub-system 510 may include an interface to directly connect with the programmable logic sub-system—bypassing the core switch 526. Such an interface may be implemented, for example, using the AMBA AXI Protocol Specification (AXI) as published by ARM.

In some implementations, the processing sub-system 510 and the programmable logic sub-system 530 may also read or write to memory locations of an on-chip memory 522 or off-chip memory (not shown) via memory controller 521. The memory controller 521 can be implemented to communicate with one or more different types of memory circuits including, but not limited to, Dual Data Rate (DDR) 2, DDR3, Low Power (LP) DDR2 types of memory, whether 16-bit, 32-bit, 16-bit with ECC, etc. The list of different memory types with which memory controller 521 is able to communicate is provided for purposes of illustration only and is not intended as a limitation or to be exhaustive. As shown in FIG. 5, the programmable IC 502 may include a memory management unit 520 and translation look-aside buffer 524 to translate virtual memory addresses used by the sub-systems 510 and 530 to physical memory addresses used by the memory controller 521 to access specific memory locations.

In this example, the programmable IC includes an I/O sub-system 550 for communication of data with external circuits. The I/O sub-system 550 may include various types of I/O devices or interfaces including for example, flash memory type I/O devices, higher performance I/O devices, lower performance interfaces, debugging I/O devices, and/or RAM I/O devices.

The I/O sub-system 550 may include one or more flash memory interfaces 560 illustrated as 560A and 560B. For example, one or more of flash memory interfaces 560 can be implemented as a Quad-Serial Peripheral Interface (QSPI) configured for 4-bit communication. One or more of flash memory interfaces 560 can be implemented as a parallel 8-bit NOR/SRAM type of interface. One or more of flash memory interfaces 560 can be implemented as a NAND interface configured for 8-bit and/or 16-bit communication. It should be appreciated that the particular interfaces described are provided for purposes of illustration and not limitation. Other interfaces having different bit widths can be used.

The I/O sub-system 550 can include one or more interfaces 562 providing a higher level of performance than flash memory interfaces 560. Each of interfaces 562A-562C can be coupled to a DMA controller 564A-564C respectively. For example, one or more of interfaces 562 can be implemented as a Universal Serial Bus (USB) type of interface. One or more of interfaces 562 can be implemented as a gigabit Ethernet type of interface. One or more of interfaces 562 can be implemented as a Secure Digital (SD) type of interface. One or more of interfaces 562 can be implemented as a PCIe interface.

The I/O sub-system 550 may also include one or more interfaces 566 such as interfaces 566A-566D that provide a lower level of performance than interfaces 562. For example, one or more of interfaces 566 can be implemented as a General Purpose I/O (GPIO) type of interface. One or more of interfaces 566 can be implemented as a Universal Asynchronous Receiver/Transmitter (UART) type of interface. One or more of interfaces 566 can be implemented in the form of a Serial Peripheral Interface (SPI) bus type of interface. One or more of interfaces 566 can be implemented in the form of a Controller-Area-Network (CAN) type of interface and/or an $I^2C$ type of interface. One or more of interfaces 566 also can be implemented in the form of a Triple Timer Counter (TTC) and/or a Watchdog Timer (WDT) type of interface.

The I/O sub-system 550 can include one or more debug interfaces 568 such as processor JTAG (PJTAG) interface 568A and a trace interface 568B. PJTAG interface 568A can provide an external debug interface for the programmable IC 502. Trace interface 568B can provide a port to receive debug, e.g., trace, information from the processing sub-system 510 or the programmable logic sub-system 530.

As shown, each of interfaces 560, 562, 566, and 568 can be coupled to a multiplexer 570. Multiplexer 570 provides a plurality of outputs that can be directly routed or coupled to external pins of the programmable IC 502, e.g., balls of the package within which the programmable IC 502 is disposed. For example, I/O pins of programmable IC 502 can be shared among interfaces 560, 562, 566, and 568. A user can configure multiplexer 570, via a configuration data stream to select which of interfaces 560-568 are to be used and, therefore, coupled to I/O pins of programmable IC 502 via multiplexer 570. The I/O sub-system 550, may also include a fabric multiplexer I/O (FMIO) interface (not shown) to connect interfaces 562-568 to programmable logic circuits of the programmable logic sub-system. Additionally or alternatively, the programmable logic sub-system 530 can be configured to implement one or more I/O circuits within programmable logic. In this example, the programmable IC 502 includes sub-system 540 having various circuits for power and/or safety management. For example, the sub-system 540 may include a power management unit 546 configured to monitor and maintain one or more voltage domains used to power the various sub-systems of the programmable IC 502. In some implementations, the power management unit 546 may disable power of individual sub-systems, when idle, to reduce power consumption, without disabling power to sub-systems in use.

The sub-system 540 may also include safety circuits to monitor the status of the sub-systems to ensure correct operation. For instance, the sub-system 540 may include one or more real-time processors 542 configured to monitor the status of the various sub-systems (e.g., as indicated in status registers 544). The real-time processors 542 may be configured to perform a number of tasks in response to detecting errors. For example, for some errors, the real-time processors 542 may generate an alert in response to detecting an error. As another example, the real-time processors 542 may reset a sub-system to attempt to restore the sub-system to correct operation. The sub-system 540 includes a switch network 548 that may be used to interconnect various sub-systems. For example, the switch network 548 may be configured to connect the various sub-systems 510, 530, and 540 to various interfaces of the I/O sub-system 550. In some applications, the switch network 548 may also be used to isolate the real-time processors 542 from the sub-systems that are to be monitored. Such isolation may be required by certain application standards (e.g., IEC-61508 SIL3 or ISO-26262 standards) to ensure that the real-time processors 542 are not affected by errors that occur in other sub-systems.

The integrated logic analyzer circuit 580 is configured to probe data of a data bus included in or connected between one or more of the sub-systems 510, 530, 540, or 550 in the programmable IC 502. In some implementations, samples of signals transmitted on the data bus may be provided to the integrated logic analyzer circuit 580 over a signal path 582 through switch 540. Additionally or alternatively, the integrated logic analyzer circuit 580 may receive samples of signals transmitted on the data bus over dedicated signal lines (not shown). The integrated logic analyzer circuit 580 may receive test data input or debug control signals and output sampled data signals via one or more communication circuits in I/O sub-system 550 such as JTAG interface 568. In some implementations, the integrated logic analyzer circuit 580 is coupled to communication circuits in I/O sub-system 550 via a signal path through switch 540. Alternatively or additionally, the integrated logic analyzer circuit 580 may be directly coupled to communication circuits in I/O sub-system 550 via a dedicated signal line (e.g., dashed signal line 584).

Figure 6:
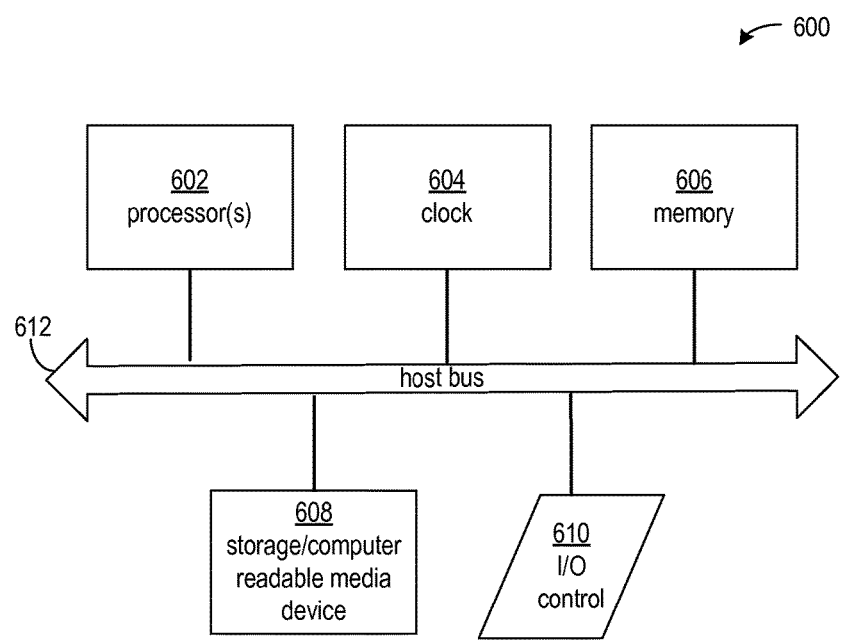
FIG. 6 shows an example of a computing arrangement on which the disclosed processes and data structures may be implemented.

FIG. 6 shows a block diagram of an example computing device that may be configured to implement the data structures and processes described herein. It will be appreciated that various alternative computing devices, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing device 600 includes an arrangement of one or more processors 602, a clock signal generator 604, a memory arrangement 606, a storage arrangement 608, and an input/output control unit 610, all coupled to a host bus 612. The arrangement 600 may be implemented with separate components on a circuit board or may be implemented internally within an integrated circuit. When implemented internally within an integrated circuit, the processor computing device is otherwise known as a microcontroller.

The architecture of the computing device depends on implementation requirements as would be recognized by those skilled in the art. The processor(s) 602 may be one or more general purpose processors, or a combination of one or more general purpose processors and suitable co-processors, or one or more specialized processors (e.g., RISC, CISC, pipelined, etc.).

The memory arrangement 606 typically includes multiple levels of cache memory, and a main memory. The storage arrangement 608 may include local and/or remote persistent storage, such as provided by magnetic disks (not shown), flash, EPROM, or other non-volatile data storage. The storage unit may be read or read/write capable. Further, the memory arrangement 606 and storage arrangement 608 may be combined in a single arrangement.

The processor(s) 602 executes the software in storage arrangement 608 and/or memory arrangement 606, reads data from and stores data to the storage arrangement 608 and/or memory arrangement 606, and communicates with external devices through the input/output control arrangement 610. These functions are synchronized by the clock signal generator 604. The resource of the computing device may be managed by either an operating system (not shown), or a hardware control unit (not shown).

Those skilled in the art will appreciate that various alternative computing arrangements, including one or more processors and a memory arrangement configured with program code, would be suitable for hosting the processes and data structures disclosed herein. In addition, the processes may be provided via a variety of computer-readable storage media or delivery channels such as magnetic or optical disks or tapes, electronic storage devices, or as application services over a network.

The disclosed methods and circuits are thought to be applicable to a variety of systems and applications. Other aspects and features will be apparent to those skilled in the art from consideration of the specification. Though aspects and features may in some cases be described in individual figures, it will be appreciated that features from one figure can be combined with features of another figure even though the combination is not explicitly shown or explicitly described as a combination. Various ones of disclosed processes and circuits may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. An apparatus, comprising:
   a logic circuit configured to communicate data over a data bus according to a communication protocol; and
   a logic analyzer circuit coupled to the data bus and configured and arranged to:
   capture, in response to a control signal, samples of data signals communicated on the data bus, wherein each sample is a quantized analog signal characteristic;
   determine respective pairs of start and end positions of data transactions in the captured samples;
   temporally align the start and end positions with respective ones of the samples of data signals; and
   output the samples of the data signals and a set of metadata including the determined pairs of start and end positions of individual data transactions in the samples and the temporally aligned start and end positions.

2. The apparatus of claim 1, wherein the logic analyzer circuit includes:

a data bus monitor circuit coupled to the data bus and configured and arranged, when enabled, to perform the capture of the samples and determining of the respective pairs of start and end positions, and a control circuit configured to enable the data bus monitor circuit in response to the control signal.

3. The apparatus of claim 2, wherein the logic analyzer circuit further includes a protocol compliance circuit coupled to the data bus and configured and arranged to:

monitor data transactions on the data bus for compliance with the communication protocol, and enable the data bus monitor circuit in response to detecting a violation of the communication protocol by a data transaction on the data bus.

4. The apparatus of claim 3, wherein the determined set of metadata further indicates a position of the violation detected in the samples.

5. The apparatus of claim 3, wherein:

the protocol compliance circuit is further configured and arranged to generate, in response to detecting a violation of the communication protocol, error status data indicating a type of violation detected and the set of metadata includes the error status data.

6. The apparatus of claim 5, wherein the logic analyzer circuit includes a storage circuit;

the data bus monitor circuit is further configured to store the captured samples of the data signals and the set of metadata in the storage circuit; and the protocol compliance circuit is further configured to store the error status data in the storage circuit.

7. The apparatus of claim 6, wherein the control circuit is configured to align the samples and the error status data in time prior to outputting the samples and the set of metadata.

8. The apparatus of claim 5, wherein the control circuit is configured and arranged to read and output the samples and the set of metadata from the logic analyzer circuit in response to a second control signal.

9. The apparatus of claim 8, wherein the apparatus further comprises a computing device communicatively coupled to the logic analyzer circuit via a debug data link and configured to:

receive the samples via the debug data link;

display the samples in a graphical user interface (GUI).

10. The apparatus of claim 9, wherein the computing device is further configured to in response to user input via the GUI, provide the control signal to the logic analyzer circuit via the debug data link.

11. The apparatus of claim 1, wherein:

the samples include at least one burst-mode transaction; and the set of metadata further indicates a number of individual data transactions in each burst-mode transaction in the samples.

12. The apparatus of claim 1, wherein the set of metadata further indicates latency of each of the data transactions.

13. The apparatus of claim 1, wherein the set of metadata further indicates a number of idle cycles in the samples.

14. The apparatus of claim 1, wherein the set of metadata further indicates a throughput of each of the data transactions.

15. The apparatus of claim 1, wherein the set of metadata further indicates a byte count of each of the data transactions.

16. A method, comprising using a logic analyzer circuit coupled to a data bus for communication by a logic circuit:

capturing, in response to a control signal, samples of data signals communicated on the data bus, wherein each sample is a quantized analog signal characteristic;

determining a respective start position and a respective end position of each data transaction in the captured samples;

temporally aligning the start and end positions with respective ones of the samples of data signals; and outputting the samples of the data signals and a set of metadata including the determined pairs of start and end positions of the data transactions in the samples and the temporally aligned start and end positions.

17. The method of claim 16, wherein:

the logic circuit is configured to communicate data transactions over the data bus according to a communication protocol; and the method further comprises, monitoring data transactions on the data bus for compliance with the communication protocol, and capturing samples of the data signals communicated on the data bus in response to detecting a violation of the communication protocol by a data transaction on the data bus.

18. The method of claim 17, further comprising:

in response to detecting the violation of the communication protocol by the data transaction, determining a position of the detected violation in the samples and a type of the detected violation; and wherein the set of metadata further indicates the determined position of the detected violation in the samples and the determined type of the detected violation.

19. The method of claim 16, further comprising using the logic analyzer circuit:

determining a set of performance metrics including latency exhibited by the data bus, throughput exhibited by the data bus, a number of idle cycles on the data bus, number of data transactions, byte count of the data transactions, or combinations thereof; and wherein the set of metadata further includes the determined set of performance metrics.

20. The method of claim 16, wherein:

the outputting of the samples of the data signals and the set of metadata includes communicating the samples of the data signals and the set of metadata to a debugging tool coupled to the logic analyzer circuit via a data link; and the method further comprises, in response to receiving the samples of the data signals by the debugging tool, displaying the samples as a waveform with graphical markers for events specified by the metadata, the events including the determined start and end positions of data transactions in the samples of the data signals.

* * * * *